United States Patent
Chen et al.

(10) Patent No.: US 10,447,215 B2
(45) Date of Patent: Oct. 15, 2019

(54) CURRENT COMPENSATION CIRCUIT

(71) Applicant: RICHWAVE TECHNOLOGY CORP., Taipei (TW)

(72) Inventors: Chih-Sheng Chen, Taipei (TW); Chang-Yi Chen, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 15/862,598

(22) Filed: Jan. 4, 2018

(65) Prior Publication Data

US 2019/0041890 A1 Feb. 7, 2019

(30) Foreign Application Priority Data

Aug. 2, 2017 (TW) .............................. 106126076 A

(51) Int. Cl.
*H03F 3/21* (2006.01)
*H03F 3/19* (2006.01)
*H03F 3/189* (2006.01)
*H03F 3/24* (2006.01)
*H03F 3/191* (2006.01)
*H03F 1/02* (2006.01)
*H03F 1/14* (2006.01)

(52) U.S. Cl.
CPC ........... *H03F 3/211* (2013.01); *H03F 1/0233* (2013.01); *H03F 1/14* (2013.01); *H03F 3/189* (2013.01); *H03F 3/19* (2013.01); *H03F 3/191* (2013.01); *H03F 3/21* (2013.01); *H03F 3/24* (2013.01); *H03F 3/245* (2013.01); *H03F 2200/408* (2013.01); *H03F 2200/451* (2013.01); *H03F 2200/456* (2013.01)

(58) Field of Classification Search
CPC . H03F 3/189; H03F 3/19; H03F 3/191; H03F 3/21; H03F 3/211; H03F 3/24
See application file for complete search history.

(56) References Cited

U.S. PATENT DOCUMENTS

| | | |
|---|---|---|
| 4,592,073 A | 5/1986 | Watanabe |
| 5,128,629 A | 7/1992 | Trinh |
| 5,363,057 A | 11/1994 | Furuno |
| 5,497,125 A | 3/1996 | Royds |
| 5,777,516 A | 7/1998 | Koifman et al. |

(Continued)

*Primary Examiner* — Thomas J. Hiltunen
(74) *Attorney, Agent, or Firm* — Winston Hsu

(57) ABSTRACT

A current compensation circuit for providing a current to an amplifier circuit includes a first amplifier, a first transistor and a first bias circuit. The first bias circuit provides a first bias current to the first amplifier. The current compensation circuit includes a power detection circuit, an operational amplifier circuit and a current-to-voltage converter. The power detection circuit detects and converts an input power or an output power of the first amplifier to a first detection voltage. The operational amplifier circuit generates a second detection voltage according to the first detection voltage and a calibration voltage. The current-to-voltage converter converts the second detection voltage to a compensation current. A first compensation current flows to the first amplifier through the first transistor according to the compensation current, such that the first amplifier is driven by the first bias current plus the first compensation current.

20 Claims, 11 Drawing Sheets

(56) References Cited

U.S. PATENT DOCUMENTS

| | | | | |
|---|---|---|---|---|
| 6,130,579 | A * | 10/2000 | Iyer | H03F 1/0261 330/133 |
| 6,605,999 | B2 * | 8/2003 | Matsushita | H03F 1/0233 330/133 |
| 6,917,322 | B2 * | 7/2005 | Ueno | H03M 1/0604 327/103 |
| 7,116,173 | B2 * | 10/2006 | Tsutsui | H03F 1/0205 330/285 |
| 7,352,244 | B2 * | 4/2008 | Takahashi | H03F 1/0205 330/129 |
| 7,368,988 | B2 * | 5/2008 | Matsumoto | H03F 1/30 330/133 |
| 7,408,412 | B2 * | 8/2008 | Yamamoto | H03F 1/302 330/285 |
| 7,408,413 | B2 | 8/2008 | Ripley | |
| 7,486,142 | B2 * | 2/2009 | Tsurumaki | H03F 1/302 330/285 |
| 7,489,196 | B2 * | 2/2009 | Vaiana | H03F 1/0261 330/285 |
| 7,683,712 | B2 * | 3/2010 | Suzaki | H03F 1/30 330/129 |
| 7,761,065 | B2 | 7/2010 | Drogi et al. | |
| 8,008,974 | B2 * | 8/2011 | Ha | H03F 1/0261 330/278 |
| 8,344,806 | B1 * | 1/2013 | Franck | H03F 1/0261 330/285 |
| 8,890,616 | B2 * | 11/2014 | Scott | H03G 3/3042 330/285 |
| 9,287,832 | B2 * | 3/2016 | Hagisawa | H03F 1/30 |
| 9,602,060 | B2 * | 3/2017 | Gorbachov | H03F 1/0266 |
| 9,787,271 | B2 * | 10/2017 | Lautzenhiser | H03G 3/3036 |
| 9,882,533 | B2 * | 1/2018 | Shimamune | H03F 1/0222 |
| 10,187,019 | B1 * | 1/2019 | Hietala | H03F 1/52 |
| 2015/0077185 | A1 * | 3/2015 | Ding | H03F 1/302 330/285 |
| 2018/0262166 | A1 * | 9/2018 | Takagi | H03F 1/56 |

* cited by examiner

CURRENT COMPENSATION CIRCUIT

CROSS REFERENCE TO RELATED APPLICATION

This application is based on, and claims priority of Taiwan application No. 106126076, which was filed on Aug. 2, 2017, and is herein incorporated by reference.

TECHNICAL FIELD

The present disclosure relates to a current compensation circuit; in particular, to a current compensation circuit that provides a compensation current to raise the bias current of an amplifier circuit.

BACKGROUND

The power amplifier circuit is important to a radio frequency emitter circuit. The power amplifier circuit is usually configured at the front-end circuit of an RF transmitter for amplifying and then outputting a signal. The power amplifier circuit is the most power consuming circuit at the front-end circuit of the RF transmitter, and is widely used in broadband electronic devices and equipment, such as mobile phones, tablets, satellite communication devices or the like. Among these applications, the power amplifier circuit is essential for mobile phones.

However, the linearity of the power amplifier circuit can be bad especially when its output power gets large, because the gain of the power amplifier circuit will drop gradually with an increase of its output power when the amplifier circuit gets saturated. This often happens to a multi-stage amplifier circuit.

SUMMARY

The present disclosure provides a current compensation circuit for providing a current to an amplifier circuit. The amplifier circuit includes a first amplifier, a first transistor and a first bias circuit. The first bias circuit provides a first bias current to the first amplifier. The first bias circuit is coupled to the first transistor. The current compensation circuit includes a power detection circuit, an operational amplifier circuit and a voltage-to-current converter. The power detection circuit is coupled to the first amplifier. The power detection circuit detects an input power or an output power of the first amplifier, and converts a detected power to a first detection voltage. The operational amplifier circuit is coupled to the power detection circuit. The operational amplifier circuit generates a second detection voltage according to the first detection voltage and a calibration voltage. The voltage-to-current converter is coupled to the operational amplifier circuit. The voltage-to-current converter converts the second detection voltage to a compensation current. The voltage-to-current converter is coupled to the first transistor. A first compensation current flows to the first amplifier or the first bias circuit through the first transistor according to the compensation current for driving the first amplifier.

The present disclosure provides another current compensation circuit for providing a current to an amplifier circuit. The amplifier circuit includes a first amplifier, a first transistor and a first bias circuit, a second amplifier, a second transistor and a second bias circuit, and a third amplifier. The first bias circuit provides a first bias current to the first amplifier, and the second bias circuit provides a second bias current to the second amplifier. The first bias circuit and the second bias circuit are coupled to first transistor and the second transistor respectively. The current compensation circuit includes a power detection circuit, an operational amplifier circuit and a voltage-to-current converter. The power detection circuit is coupled to an output end of the first amplifier or an output end of the second amplifier. The power detection circuit detects an output power of the first amplifier or an output power of the second amplifier, and converts a detected power to a first detection voltage. The operational amplifier circuit is coupled to the power detection circuit. The operational amplifier circuit generates a second detection voltage according to the first detection voltage and a calibration voltage. The voltage-to-current converter is coupled to the operational amplifier circuit. The voltage-to-current converter converts the second detection voltage to a compensation current. The first transistor and the second transistor are coupled to the voltage-to-current converter. A first compensation current flows to the first amplifier or the first bias circuit through the first transistor according to the compensation current for driving the first amplifier, or a second compensation current flows to the second amplifier or the second bias circuit through the second transistor according to the compensation current for driving the second amplifier.

The present disclosure provides still another current compensation circuit for providing a current to an amplifier circuit. The amplifier circuit includes a first amplifier and a first transistor, and the first amplifier is coupled to a supply voltage through the first transistor. The current compensation circuit includes a detection circuit, an operational amplifier circuit and a voltage-to-current converter. The detection circuit is coupled to the first amplifier. The detection circuit outputs a first detection voltage according to the signal strength of an input signal or the signal strength of an output signal of the first amplifier. The operational amplifier circuit is coupled to the detection circuit. The operational amplifier circuit generates a second detection voltage according to the first detection voltage and a calibration voltage. The voltage-to-current converter is coupled to the operational amplifier circuit. The voltage-to-current converter converts the second detection voltage to a compensation current. The voltage-to-current converter includes a transfer transistor. The transfer transistor has a first end, a second end and a third end. The first end of the transfer transistor is coupled to the supply voltage, the third end of the transfer transistor is coupled to a reference voltage, and the second end of the transfer transistor is coupled to the operational amplifier circuit and the first transistor. The transfer transistor and the first transistor are used to form a current mirror structure.

For further understanding of the present disclosure, reference is made to the following detailed description illustrating the embodiments of the present disclosure. The description is only for illustrating the present disclosure, not for limiting the scope of the claim.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION

The aforementioned illustrations and following detailed descriptions are exemplary for the purpose of further explaining the scope of the present disclosure. Other objectives and advantages related to the present disclosure will be illustrated in the subsequent descriptions and appended drawings. In these drawings, like references indicate similar elements.

The current compensation circuit provides a compensation current to an amplifier circuit such that the amplifier circuit has a larger bias current due to the compensation current, which improves the linearity of the amplifier circuit. There are several embodiments provided as follows for illustrating but not restricting the current compensation circuit provided by the present disclosure.

[One Embodiment of the Current Compensation Circuit]

Figure 1A:
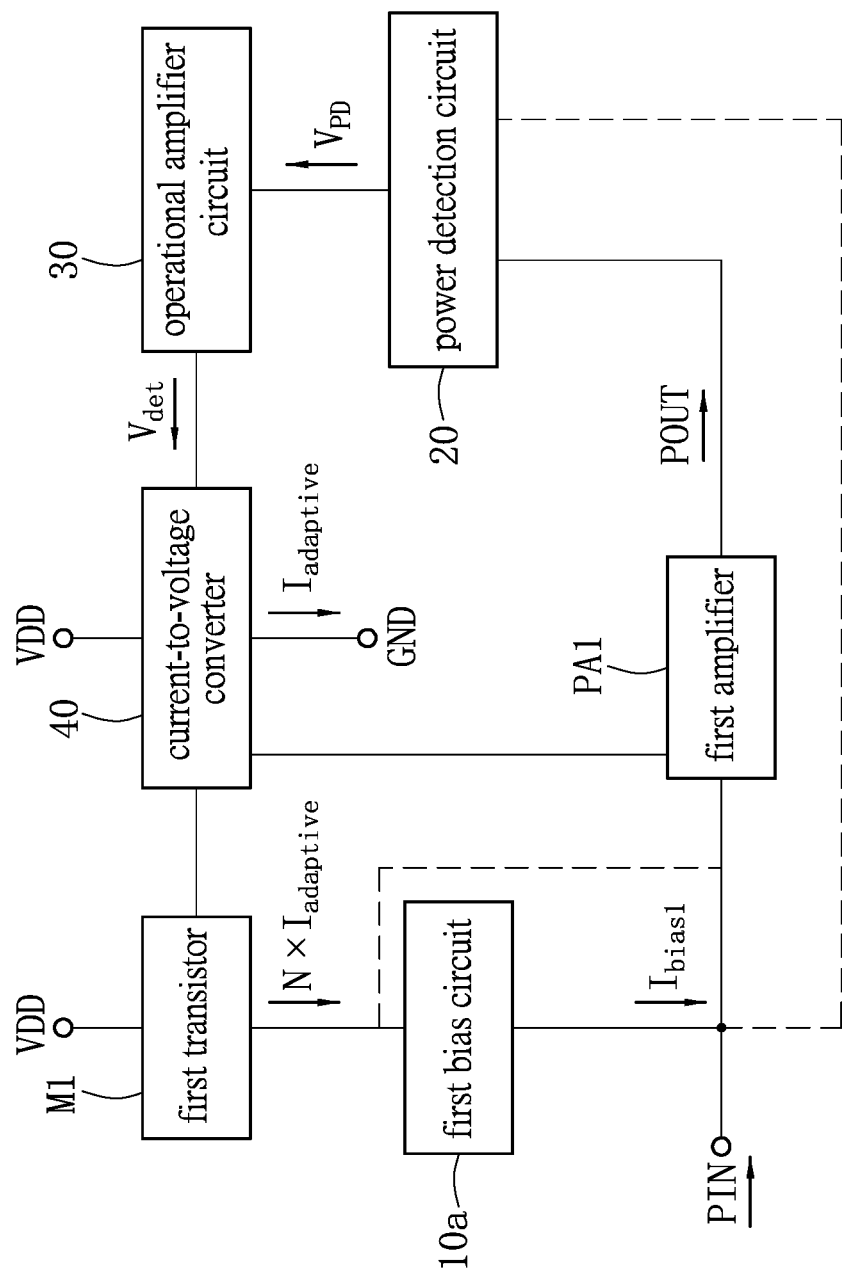
FIG. 1A shows an application block diagram of a current compensation circuit according to one embodiment of the present disclosure.

Referring FIG. 1A, an application block diagram of a current compensation circuit according to one embodiment of the present disclosure is shown.

The current compensation circuit provides a compensation current to an amplifier circuit. For example, the amplifier circuit can be shown in FIG. 1A. This amplifier circuit includes a first amplifier PA1, a first transistor M1 and a first bias circuit 10a. In this amplifier circuit, the first bias circuit 10a provides a first bias current $I_{bias1}$ to the first amplifier PA1, and the input end of the first amplifier PA1 is coupled to a supply voltage VDD through the first transistor M1.

As shown in FIG. 1A, the current compensation circuit includes a power detection circuit 20, an operational amplifier circuit 30 and a voltage-to-current converter 40. The power detection circuit 20 is coupled to the first amplifier PA1, the operational amplifier circuit 30 is coupled to the power detection circuit 20, and the voltage-to-current converter 40 is coupled to the operational amplifier circuit 30. In addition, the voltage-to-current converter 40 is further coupled to the first transistor M1 in the amplifier circuit.

The gain of the first amplifier PA1 will drop gradually with the increase of the output power POUT or the input power PIN of the first amplifier PA1 when the first amplifier PA1 gets saturated, and thus the linearity of the first amplifier PA1 is getting worse when the output power POUT or the input power PIN of the first amplifier PA1 is large. The current compensation circuit in one embodiment provides a compensation current to the first bias circuit 10a for driving the first amplifier PA1 such that the bias current of the first amplifier PA1 is larger due to the compensation current. The current compensation circuit in another embodiment provides a compensation current to the first amplifier PA1 for driving the first amplifier PA1 such that the bias current of the first amplifier PA1 is larger due to the compensation current. As a result, the gain of the first amplifier PA1 can be further raised, and thus the linearity of the first amplifier PA1 becomes better (that is, the relationship between the gain of the first amplifier PA1 and the output power of the first amplifier PA1 is improved).

According to the above description, the compensation current that the current compensation circuit provides for driving the first amplifier PA1 is related to the output power POUT or the input power PIN of the first amplifier PA1. Thus, to provide a sufficient compensation current to the first amplifier PA1, the power detection circuit 20 detects the output power POUT or the input power PIN of the first amplifier PA1, and then converts a detected power to a first detection voltage $V_{PD}$. To learn exactly how much the compensation current should be provided to the first amplifier PA1, the operational amplifier circuit 30 generates a second detection voltage $V_{det}$ according to the first detection voltage $V_{PD}$ and a calibration voltage (not shown).

Then, the voltage-to-current converter 40 converts the second detection voltage $V_{det}$ to a compensation current $I_{adaptive}$. For example, the voltage-to-current converter 40 can convert the second detection voltage $V_{det}$ to the compensation current $I_{adaptive}$ through a resistor.

When the voltage-to-current converter 40 converts the second detection voltage $V_{det}$ to the compensation current $I_{adaptive}$, a first compensation current $N \times I_{adaptive}$ is generated in the amplifier circuit and flowed to the first bias circuit 10a(solid line) or the first amplifier PA1 (dash line) from the first transistor M1 according to the compensation current $I_{adaptive}$. The current compensation circuit in one embodiment provides an additional current (that is, the first compensation current $N \times I_{adaptive}$) flows to the first bias circuit 10a through the first transistor M1, and thus the first bias circuit 10a generates a larger bias current (that is, the first bias current $I_{bias1}$) for driving the first amplifier PAL The current compensation circuit in another embodiment provides the first compensation current $N \times I_{adaptive}$ flows to the first amplifier PA1 through the first transistor M1 for driving the first amplifier PA1, and thus the first amplifier PA1 is driven by the first bias current $I_{bias1}$ plus the first compensation current $N \times I_{adaptive}$ instead of being driven merely by the first bias current $I_{bias1}$. In this embodiment, the current compensation circuit provides the first compensation current $N \times I_{adaptive}$ to the first amplifier PA1, so the first amplifier PA1 can be driven by a larger bias current. As a result, the gain of the first amplifier PA1 is further raised. Briefly, the current compensation circuit provided by this embodiment can compensate the gain of the amplifier circuit such that the gain of the amplifier circuit will be maintained better or may not drop too fast when the output power of the amplifier circuit gets saturated.

It should be noted that, the voltage-to-current converter 40 can include a transistor. This transistor and the first transistor M1 in this amplifier circuit form a current mirror structure such that the first compensation current N×$I_{adaptive}$ is directly proportional to the compensation current $I_{adaptive}$ In other words, the first compensation current N×$I_{adaptive}$ provided to the first amplifier PA1 by the current compensation circuit is N times of the compensation current $I_{adaptive}$. It is worth mentioning that, how fast the gain of the first amplifier PA1 is raised depends on the multiplying power "N". Preferably, the multiplying power "N" is designed such that the rate of raising the gain of the first amplifier PA1 is equal to the rate of the first amplifier PA1 getting saturated. As mentioned, the voltage-to-current converter 40 and the first transistor M1 in this amplifier circuit form a current mirror structure. In this case, the multiplying power "N" can be adjusted by the design for the size ratio of the transistor in the voltage-to-current converter 40 and the first transistor M1.

[Another Embodiment of the Current Compensation Circuit]

Figure 1B:
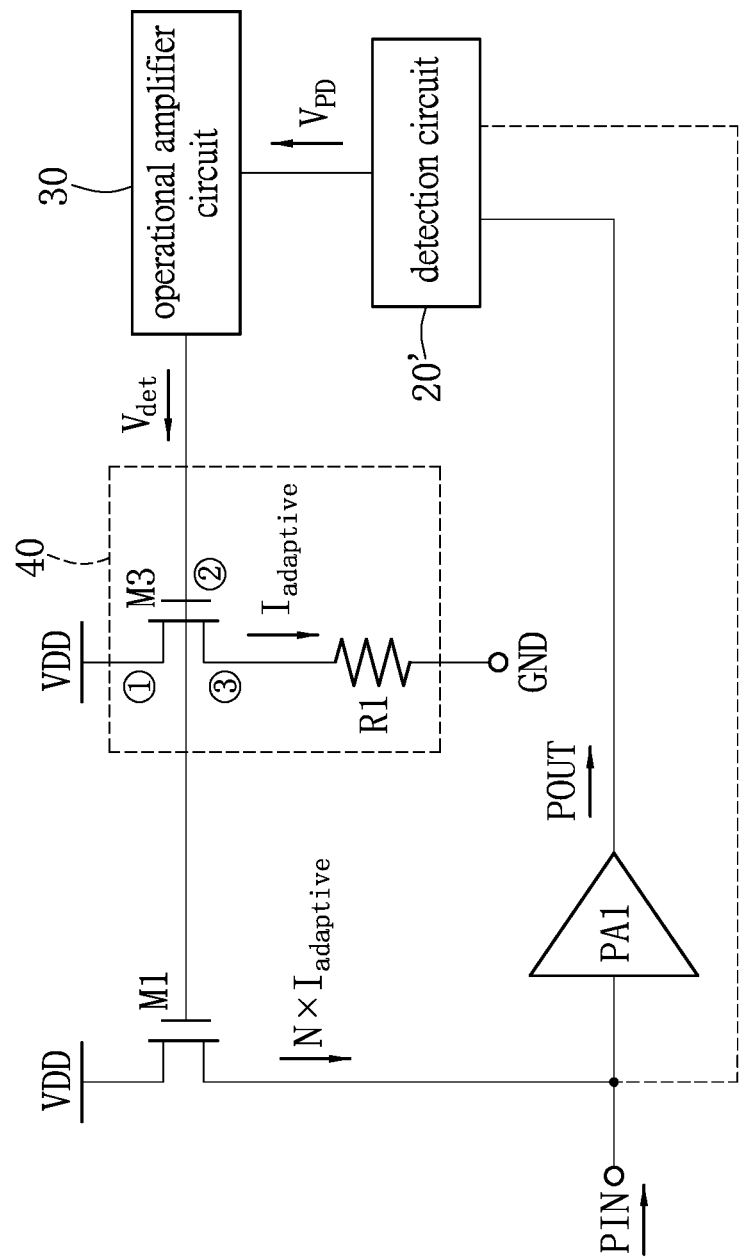
FIG. 1B shows an application block diagram of a current compensation circuit according to another embodiment of the present disclosure.

Referring to FIG. 1B, an application block diagram of a current compensation circuit according to another embodiment of the present disclosure is shown.

The current compensation circuit provides a compensation current to an amplifier circuit. For example, the amplifier can be shown in FIG. 1B. This amplifier circuit includes a first amplifier PA1 and a first transistor M1, and the first amplifier PA1 is coupled to a supply voltage VDD through the first transistor M1.

As shown in FIG. 1B, the current compensation circuit includes a detection circuit 20', an operational amplifier circuit 30 and a voltage-to-current converter 40. The detection circuit 20' is coupled to the first amplifier PA1, the operational amplifier circuit 30 is coupled to the detection circuit 20', and the voltage-to-current converter 40 is coupled to the operational amplifier circuit 30.

The detection circuit 20' outputs a first detection voltage $V_{PD}$ according to the signal strength of an input signal or the signal strength of an output signal of the first amplifier PA1. Then, the operational amplifier circuit 30 generates a second detection voltage $V_{det}$ according to the first detection voltage $V_{PD}$ and a calibration voltage (not shown). Finally, the voltage-to-current converter 40 converts the second detection voltage $V_{det}$ to a current (i.e., the compensation current $I_{adaptive}$ shown in FIG. 1B).

The current-to-voltage converter 40 includes a transfer transistor M3. The transfer transistor M3 has a first end, a second end and a third end. The first end of the transfer transistor M3 is coupled to the supply voltage VDD, the third end of the transfer transistor M3 is coupled to a reference voltage GND (such as ground voltage or common voltage), and the second end of the transfer transistor M3 is coupled to the operational amplifier circuit 30 and the first transistor M1. For ease of illustration, in FIG. 1B, the first end of the transfer transistor M3 is marked as ①, the second end of the transfer transistor M3 is marked as ②, and the third end of the transfer transistor M3 is marked as ③.

When the transfer transistor M3 receives the second detection voltage $V_{det}$ via its second end, the second detection voltage $V_{det}$ is converted to a compensation current $I_{adaptive}$ through a first resistor R according to the Ohm's Law. The transfer transistor M3 and the first transistor M1 in the amplifier circuit form a current mirror structure, so a current will be generated in the amplifier circuit when the voltage-to-current converter 40 converts the second detection voltage $V_{det}$ to the compensation current $I_{adaptive}$. This current is directly proportional to the compensation current $I_{adaptive}$, and more specifically, this current is N times of the compensation current $I_{adaptive}$.

Unlike the current compensation circuit shown in FIG. 1A, in this embodiment, the current generated from the current mirror structure which is formed by the transfer transistor M3 and the first transistor M1 in the amplifier circuit (i.e. the current which is N times of the compensation current $I_{adaptive}$) can be directly used as a bias current driving the first amplifier PA1. The multiplying power "N" can be determined according to the design for the size ratio of the transfer transistor M3 and the first transistor M1.

In this embodiment, if the amplifier circuit already includes a bias circuit, the first amplifier PA1 is driven by a bias current provided by this bias circuit plus the current generated by the current mirror structure formed by the transfer transistor M3 and the first transistor M1 in the amplifier circuit.

Moreover, in this embodiment, the detection circuit 20' can be implemented by a power detection circuit 20 shown in FIG. 1A. The power detection circuit 20 is configured to detect an input power PIN or an output power POUT of the first amplifier PA1, and converts a detected power to the first detection voltage $V_{PD}$. Thus, the current generated by the current mirror structure formed by the transfer transistor M3 and the first transistor M1 in the amplifier circuit is related to the input power PIN or the output power POUT of the first amplifier PA1. In this manner, no matter the bias current driving the first amplifier PA1 is contributed entirely or partially by the current generated by the current mirror structure formed by the transfer transistor M3 and the first transistor M1 in the amplifier circuit, the linearity of the first amplifier PA1 can be improved (i.e. the gain of the amplifier circuit can be compensated instead of dropping when the output power of the amplifier circuit gets saturated) by detecting the input power PIN or the output power POUT of the first amplifier PA1 and adjusting multiplying power "N".

[Another Embodiment of the Current Compensation Circuit]

Figure 2A:
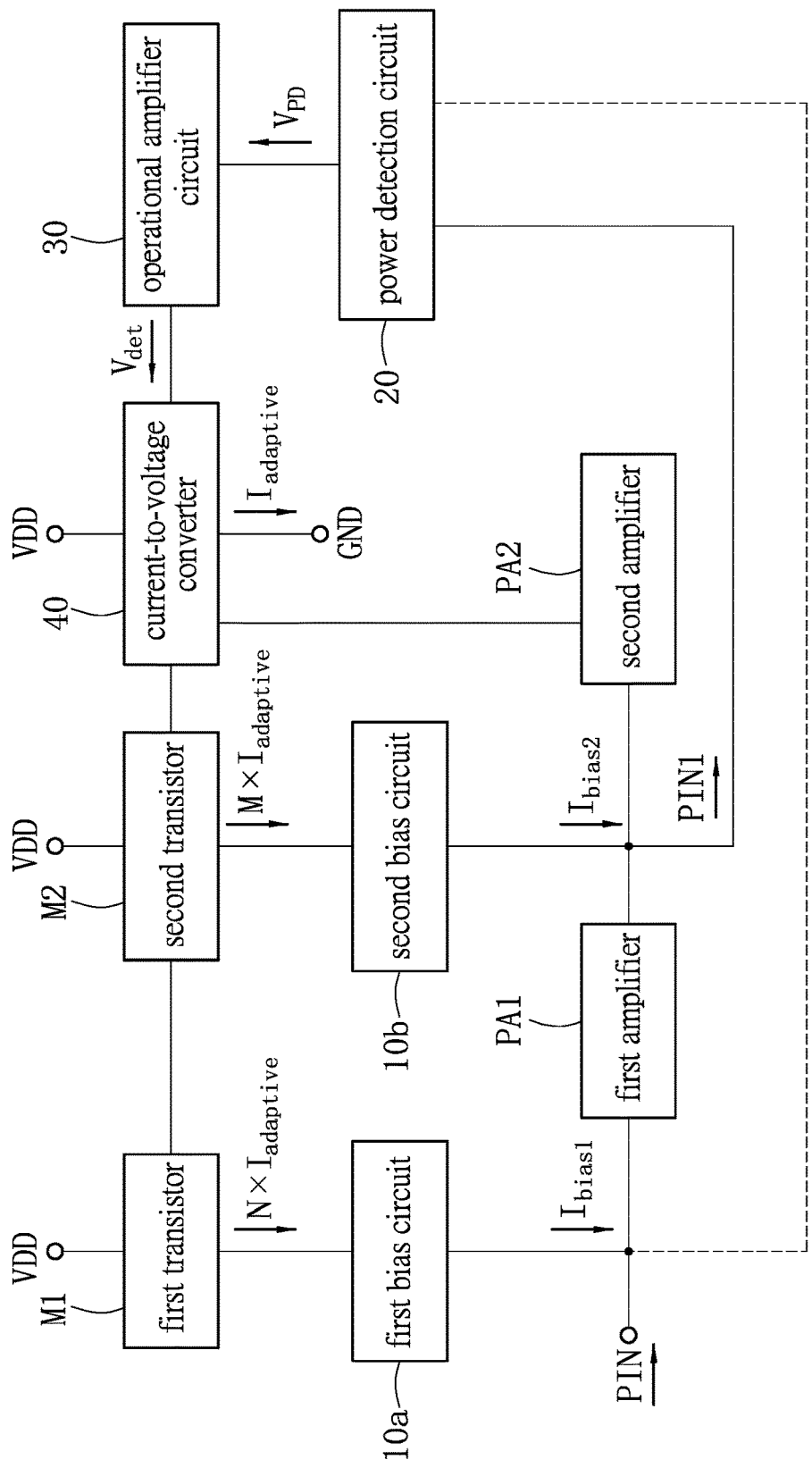
FIG. 2A shows an application block diagram of a current compensation circuit according to still another embodiment of the present disclosure.
Figure 2B:
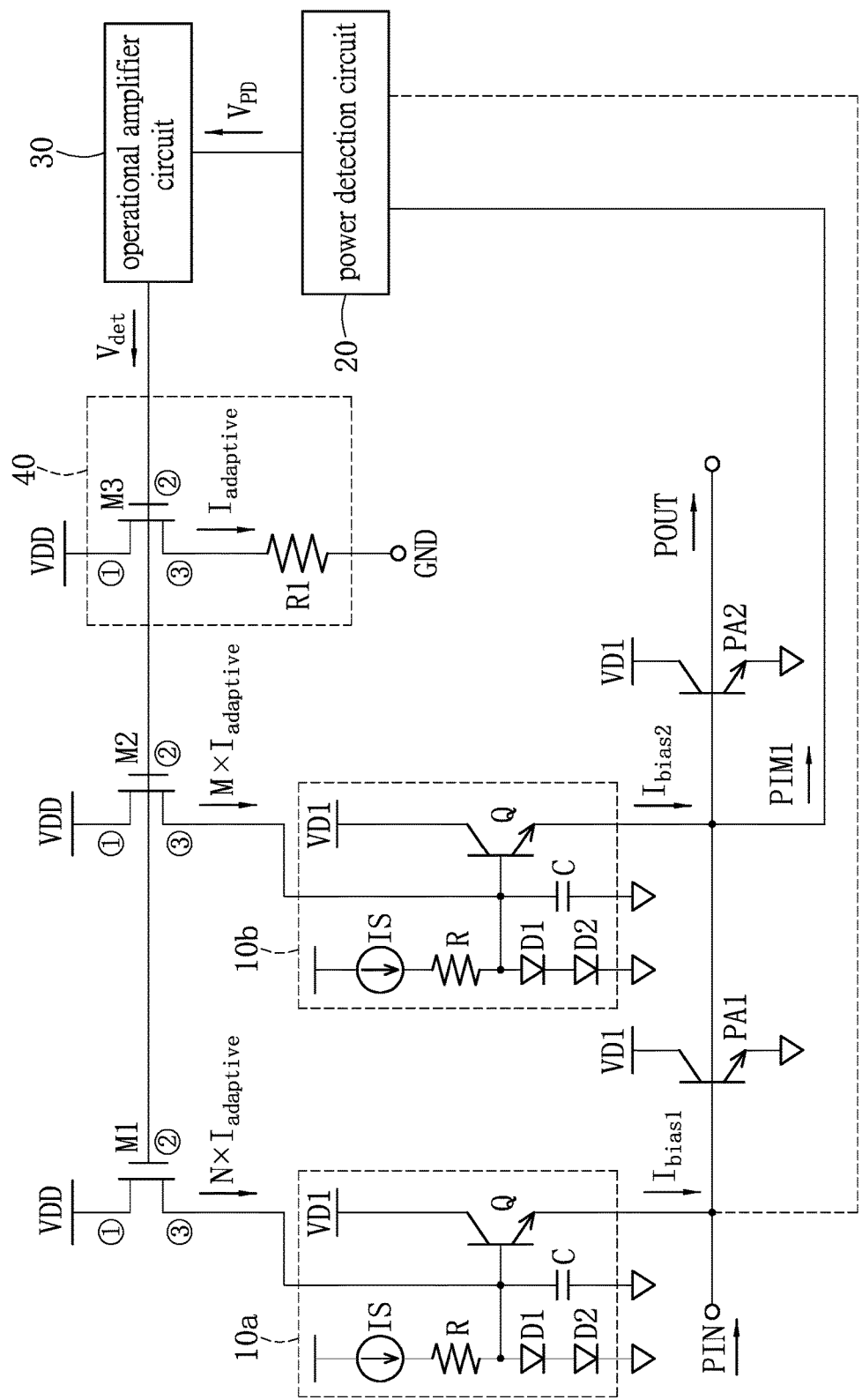
FIG. 2B shows a circuit diagram of a current compensation circuit in FIG. 2A.

Referring to FIG. 2A and FIG. 2B, FIG. 2A shows an application block diagram of a current compensation circuit according to still another embodiment of the present disclosure is shown, and FIG. 2B shows a circuit diagram of a current compensation circuit in FIG. 2A. Generally, the gain of an amplifier circuit will drop gradually with the increase of the output power or the input power of the amplifier circuit when the amplifier circuit gets saturated. Thus, the linearity of the amplifier circuit gets worse when the output power or the input power of the amplifier circuit is larger, especially for a multi-stage amplifier circuit.

The current compensation circuit in this embodiment as shown in FIG. 2A has a circuit configuration similar to the circuit configurations shown in FIG. 1A and FIG. 1B. Compared to the circuit configurations shown in FIG. 1A and FIG. 1B, the amplifier circuit in this embodiment includes a second amplifier PA2, a second transistor M2 and a second bias circuit 10b. The second amplifier PA2 has a input end and a output end. The input end of the second amplifier PA2 is coupled to the output end of the first amplifier PA1, the second amplifier PA2 is coupled to the supply voltage VDD through the second transistor M2, and the second transistor M2 is coupled to the voltage-to-current converter 40. In addition, the second bias circuit 10b provides a second bias current $I_{bias2}$ to the second amplifier PA2.

How the current compensation circuit in this embodiment works is similar to the working principle that the current compensation circuit shown in FIG. 1A generates a first compensation current N×$I_{adaptive}$ or the working principle that the current compensation circuit shown in FIG. 1B generates a current N times of the compensation current $I_{adaptive}$. In this embodiment, when the second detection voltage $V_{det}$ is converted to the compensation current $I_{adaptive}$ through a transfer transistor M3 (not shown) in the voltage-to-current converter 40. In one embodiment, the first transistor M1 and the transfer transistor M3 and the second transistor M2 and the transfer transistor M3 are formed two current mirror structures, a first compensation current N×$I_{adaptive}$ directly proportional to the compensation current $I_{adaptive}$ is correspondingly generated in the amplifier circuit and flows to the first bias circuit 10a through the first transistor M1, and a second compensation current M×$I_{adaptive}$ directly proportional to the compensation current $I_{adaptive}$ is correspondingly generated in the amplifier circuit and flows to the second bias circuit 10b through the second transistor M2.

According to the above, when the current compensation circuit was provided to a two-stage amplifier circuit, the power detection circuit 20 in the current compensation circuit detects the input power PIN or the output power PIM1 of the first amplifier PA1, and then generates the first detection voltage $V_{PD}$ according to a detect power. After that, the operational amplifier circuit 30 generates the second detection voltage $V_{det}$ according to the first detection voltage $V_{PD}$ and a calibration voltage (not shown). Finally, when the voltage-to-current converter 40 converts the second detection voltage $V_{det}$ to the compensation current $I_{adaptive}$, a first additional current (that is, a first compensation current N×$I_{adaptive}$) is correspondingly generated in the amplifier circuit and flows to the first bias circuit 10a through the first transistor M1, and a second additional current (that is, a second compensation current M×$I_{adaptive}$) is correspondingly generated in the amplifier circuit and flows to the second bias circuit 10b through the second transistor M2.

In this manner, the first amplifier PA1 is driven by a larger first bias current (that is, the first bias current $I_{bias1}$ being increased according to the first compensation current N×$I_{adaptive}$), and the second amplifier PA2 is driven by a larger second bias current (that is, the second bias current $I_{bias2}$ being increased according to the second compensation current M×$I_{adaptive}$). Thereby, even though the first amplifier PA1 and the second amplifier PA2 both have a feature that their gains will drop gradually with the increase of the input power or the output power of the first amplifier PA1 and the second amplifier PA2, their gains can be compensated because the bias current of the first amplifier PA1 and the bias current of the second amplifier PA2 get larger respectively due to the first compensation current N×$I_{adaptive}$ and the second compensation current M×$I_{adaptive}$. As a result, the linearity of the entire amplifier circuit can be maintained better.

It is worth mentioning that, in this embodiment, the multiplying power "N" can be determined according to the design for the size ratio of the transfer transistor in voltage-to-current converter 40 and the first transistor M1. Likewise, the multiplying power "M" can be determined according to the design for the size ratio of the transfer transistor in voltage-to-current converter 40 and the second transistor M2.

For example, the size ratio of the first transistor M1 to the transfer transistor M3 in the voltage-to-current converter 40 is designed to be related to the slope of a curve showing the relationship between the output power PIM1 and the input power PIN of the first amplifier PA1, the size ratio of the second transistor M2 to the transfer transistor M3 in the voltage-to-current converter 40 is designed to be related to the slope of a curve showing the relationship between the output power PIM2 and the input power PIM1 (i.e. the output power PIM1 of the first amplifier PA1) of the second amplifier PA2. It should be noted that, the size ratio of the first transistor M1 to the transfer transistor M3 of the voltage-to-current converter 40 and the size ratio of the second transistor M2 to the transfer transistor M3 of the voltage-to-current converter 40 can be equal or unequal, and they determine the multiplying power "N" and the multiplying power "M".

It is also worth mentioning that, in this embodiment, the first amplifier PA1 and the second amplifier PA2 are both implemented by a transistor, such as bipolar junction transistor as shown in FIG. 2B. The collectors of the two bipolar junction transistors are coupled to a voltage source VD1, and the emitters of the two bipolar junction transistors are coupled to a reference voltage GND (such as ground voltage or common voltage). The bases of the two bipolar junction transistors are coupled respectively to the first bias circuit 10a and the second bias circuit 10b. The bases of the two bipolar junction transistors are respectively coupled to the input ends of the first amplifier PA1 and the second amplifier PA2, and the collectors of the two bipolar junction transistors are also respectively coupled to the output ends of the first amplifier PA1 and the second amplifier PA2. A blocking capacitor $C_B$ is coupled between the output end of the first amplifier PA1 and input end of the second amplifier PA2.

In addition, the first bias circuit 10a includes a transistor, such as bipolar junction transistor Q, a current source IS, a resistor R, two diodes D1 and D2 and a capacitor C. The current source IS provides a current to the base of the bipolar junction transistor Q through the resistor R. The collector of the bipolar junction transistor Q is coupled to a voltage source VD1, and the emitter of the bipolar junction transistor Q is coupled to the base of the transistor of the first amplifier PA1. The base of the bipolar junction transistor Q is further coupled to the reference voltage GND through the two diodes D1 and D2. Moreover, the base of the bipolar junction transistor Q and the third end of the first transistor M1 are coupled, and they are further coupled to the reference voltage GND through the capacitor C. The circuit structure of the second bias circuit 10b is similar to the circuit structure of the first bias circuit 10a, and thus the repeated description is not provided herein.

In the above embodiments, the first amplifier PA1 is the first-stage amplifier of a multi-stage amplifier circuit, and the second amplifier PA2 is the second-stage amplifier of a multi-stage amplifier circuit. In addition, the power detection circuit 20 can be connected between the first-stage amplifier and the second-stage amplifier to detect the output power PIM1 (i.e. the input power of the second-stage amplifier), or the power detection circuit 20 can be connected to the input end of the first-stage amplifier to detect the input power PIN of the first-stage amplifier.

[Another Embodiment of the Current Compensation Circuit]

Figure 3:
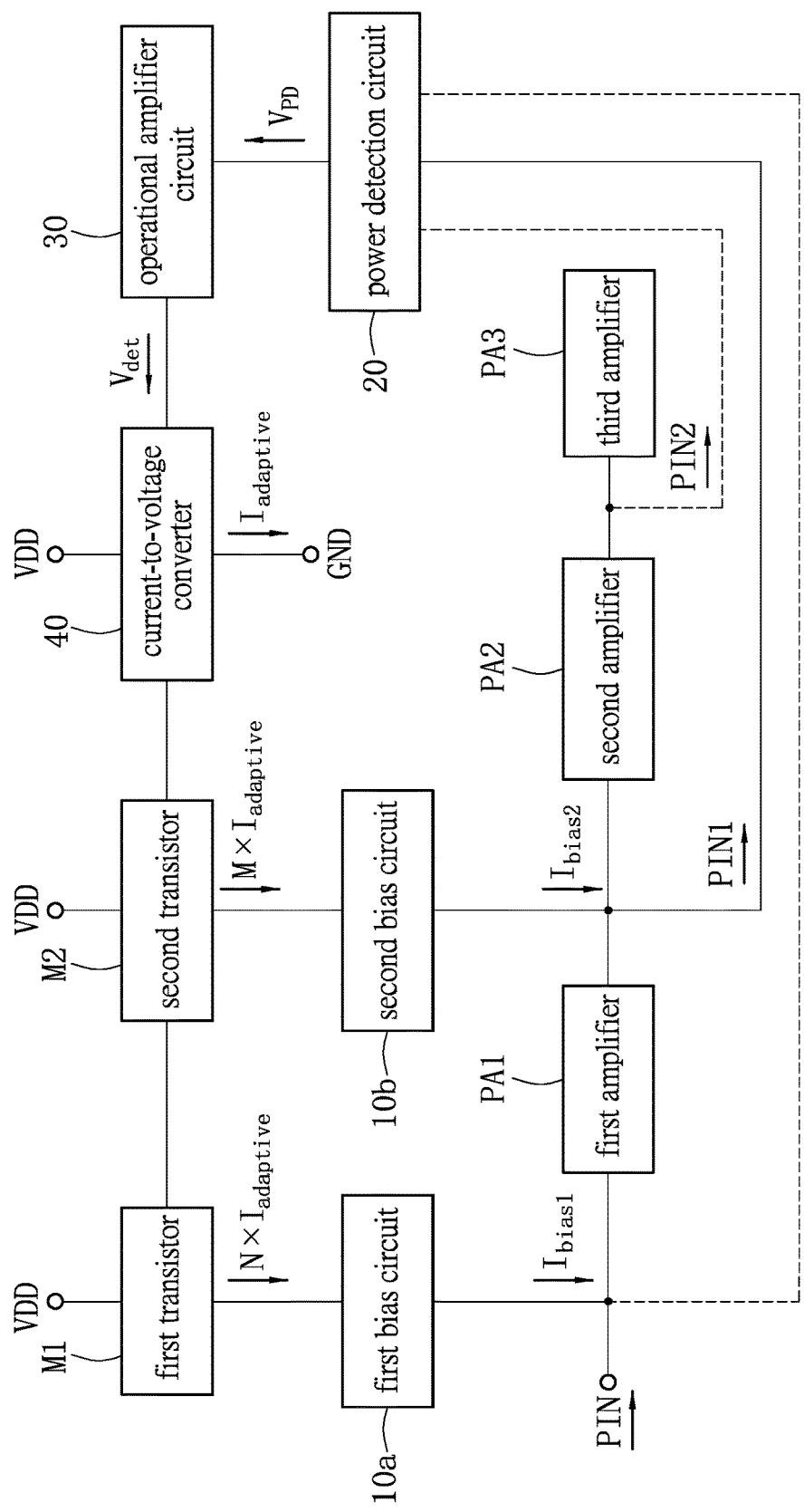
FIG. 3 shows an application block diagram of a current compensation circuit according to still another embodiment of the present disclosure.

FIG. 3 shows an application block diagram of a current compensation circuit according to still another embodiment of the present disclosure. The current compensation circuit provided by this embodiment shown in FIG. 3 is used to provide a current to a multi-stage amplifier circuit. The current compensation circuit shown in FIG. 2A and the current compensation circuit provided by this embodiment shown in FIG. 3 have similar circuit configurations, but a difference between them is that, the amplifier circuit provided by this embodiment further includes a third amplifier PA3. In addition, the first amplifier PA1 is the first-stage amplifier of a multi-stage amplifier circuit, the second amplifier PA2 is the second-stage amplifier of a multi-stage amplifier circuit, and the third amplifier PA3 is the third-stage amplifier of a multi-stage amplifier circuit.

The current compensation circuit shown in FIG. 2A provides a compensation current $I_{adaptive}$ according to the input power PIN of the first amplifier PA1 or the output power PIM1 of the first amplifier PA1 (i.e. the input power of the second amplifier PA2). Differently, in this embodiment, in addition to the input power PIN of the first amplifier PA1 or the output power PIM1 of the first amplifier PA1, the current compensation circuit also can provide a compensation current $I_{adaptive}$ according to the output power PIM2 of the second amplifier PA2.

Except for the above differences, the current compensation circuit shown in FIG. 2A and the current compensation circuit provided by this embodiment have similar working principles. Thus, other details about the current compensation circuit provided by this embodiment can be referred to the previous description.

Figure 4A:
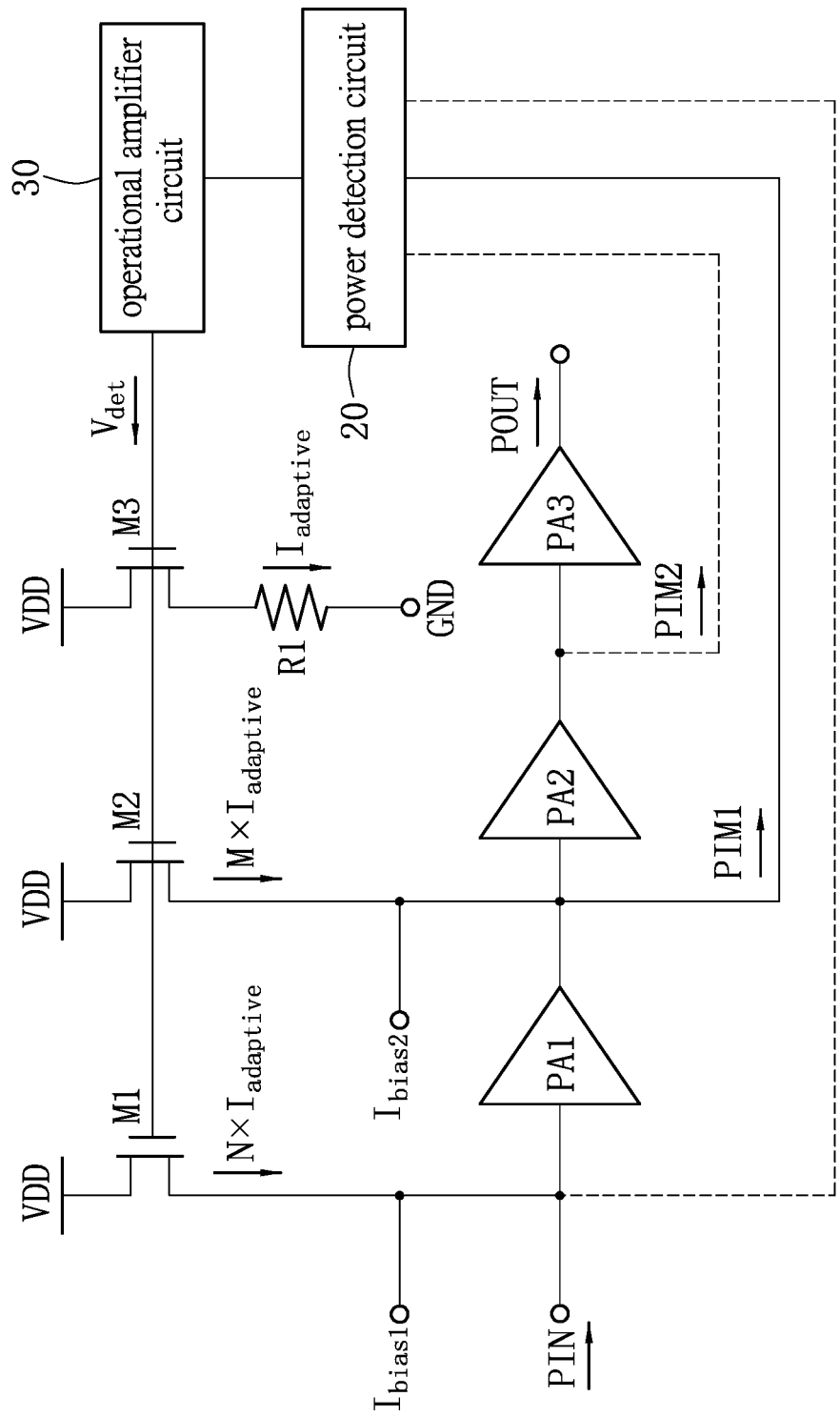
FIG. 4A shows an application block diagram of a current compensation circuit according to still another embodiment of the present disclosure.

FIG. 4A shows an application block diagram of a current compensation circuit according to still another embodiment of the present disclosure. The current compensation circuit in this embodiment has a circuit configuration similar to the circuit configurations shown in FIG. 3. Compared to the circuit configurations shown in FIG. 3, when the transfer transistor M3 of voltage-to-current converter 40 converts the second detection voltage $V_{det}$ to the compensation current $I_{adaptive}$, a first compensation current $N \times I_{adaptive}$ is generated in the amplifier circuit and flowed to the first amplifier PA1 from the first transistor M1 according to the compensation current $I_{adaptive}$, and a second compensation current $M \times I_{adaptive}$ is generated in the amplifier circuit and flowed to the first amplifier PA2 from the second transistor M2 according to the compensation current $I_{adaptive}$. Thus, the first amplifier PA1 is driven by the first bias current $I_{bias1}$ plus the first compensation current $N \times I_{adaptive}$, and the second amplifier PA2 is driven by the second bias current $I_{bias2}$ plus the second compensation current $M \times I_{adaptive}$. In this embodiment, the current compensation circuit provides the first compensation current $N \times I_{adaptive}$ and the second compensation current $M \times I_{adaptive}$ to the first amplifier PA1 and the second amplifier PA2 respectively, so the first amplifier PA1 and the second amplifier PA2 can be driven by a larger bias current.

Figure 4B:
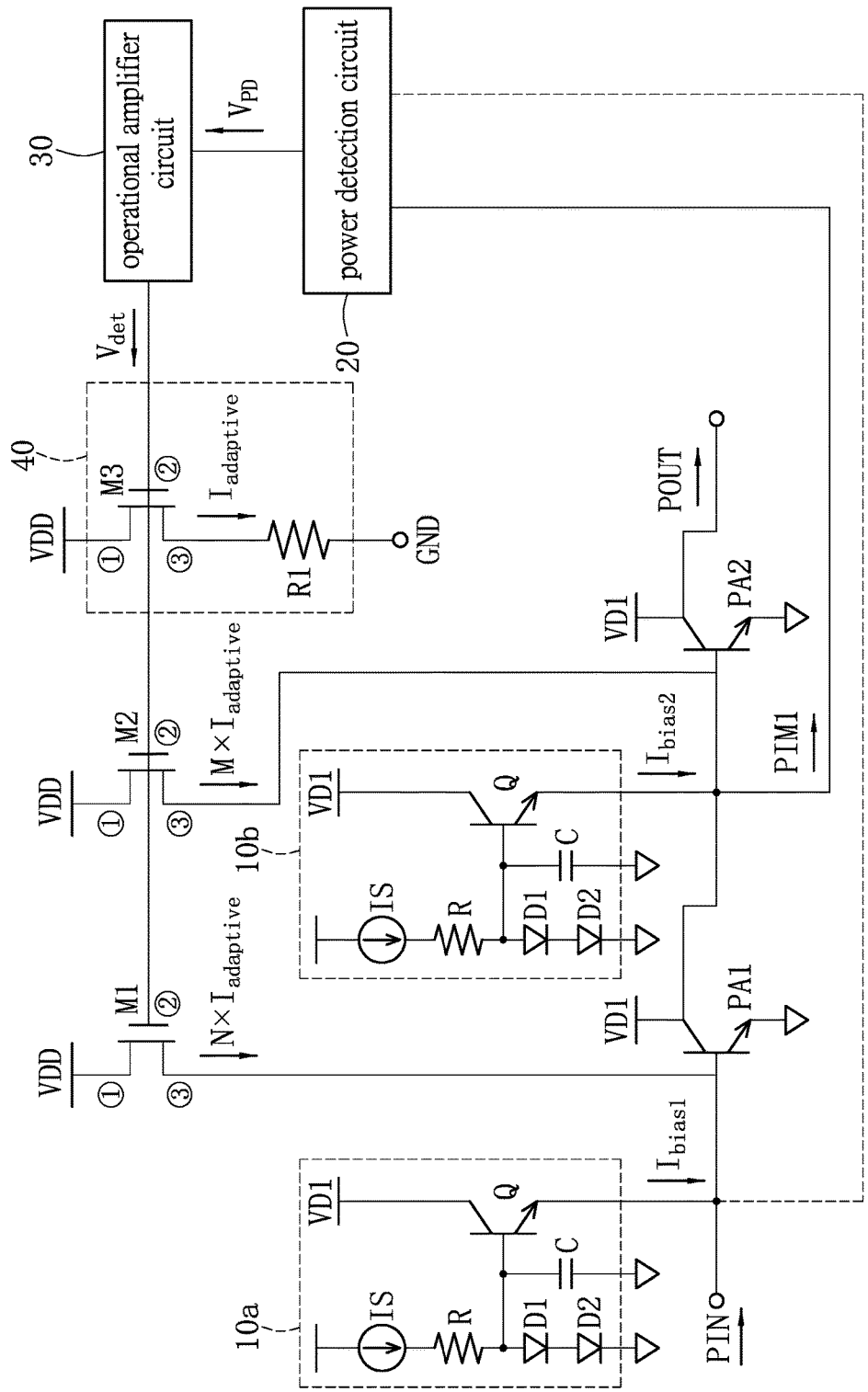
FIG. 4B shows a circuit diagram of a current compensation circuit in FIG. 4A.

FIG. 4B shows a circuit diagram of a current compensation circuit in FIG. 4A. The current compensation circuit in this embodiment has a circuit configuration similar to the circuit configurations shown in FIG. 2B. Compared to the circuit configurations shown in FIG. 2B, the third end of the first transistor M1 is coupled to the emitter of the bipolar junction transistor Q of the first bias circuit 10a and the base of the bipolar junction transistors of the first amplifier PA1. The third end of the second transistor M2 is coupled to the emitter of the bipolar junction transistor Q of the second bias circuit 10b and the base of the bipolar junction transistors of the second amplifier PA2.

The gain of the first amplifier PA1 will drop gradually with the increase of the output power POUT or the input power PIN of the first amplifier PA1 when the first amplifier PA1 gets saturated, and thus the linearity of the first amplifier PA1 is getting worse when the output power POUT or the input power PIN of the first amplifier PA1 is large. The current compensation circuit in one embodiment provides a compensation current to the first bias circuit 10a for driving the first amplifier PA1 such that the bias current of the first amplifier PA1 is larger due to the compensation current.

Figure 5A:
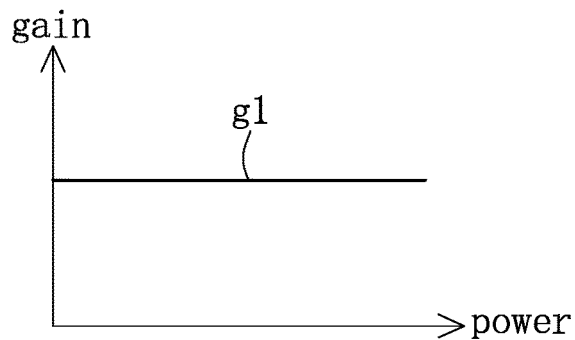
FIGS. 5A-5C are gain curve diagrams showing the relationship between the output power of the amplifier circuit and the gain of the amplifiers of the amplifier circuit.
Figure 5B:
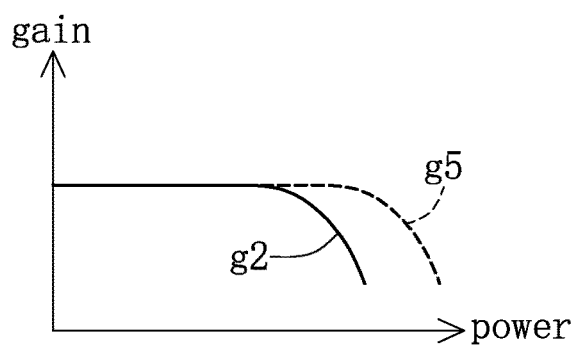
Figure 5C:
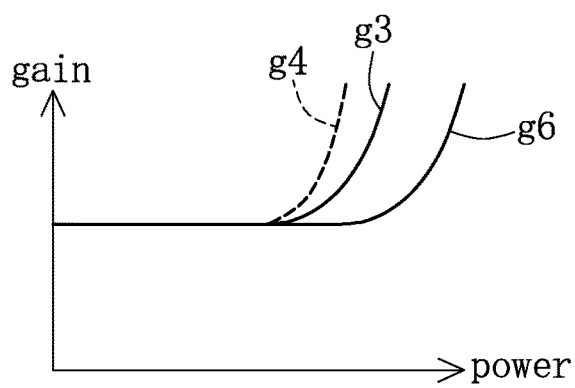

FIGS. 5A-5C are gain curve diagrams showing the relationship between the output power and the gain of the amplifiers of the amplifier circuit. Take a example for a general multi-stage amplifier circuit, FIG. 5A shows the relationship between the output power and the gain of first-stage amplifier, and FIG. 5B shows the relationship between the output power and the gain of a multi-stage amplifier circuit. As shown by the curve g1 in FIG. 5A, with an increase of the output power POUT of a general multi-stage amplifier circuit, the gain of the first-stage amplifier roughly remains a constant.

In conjunction with FIG. 5A and FIG. 5B, with an increase of the output power POUT of a general multi-stage amplifier circuit, the gain of the multi-stage amplifier circuit will drop gradually, just like the g2 curve in FIG. 5B. In other words, when the output power of a general multi-stage amplifier circuit gets large, the linearity of the multi-stage amplifier circuit is getting worse and thus the gain of the multi-stage amplifier circuit becomes unpredictable. However, the current compensation circuit provided by each of the previously mentioned embodiments could improve that.

Further description, if the bias current of the first-stage amplifier of a general multi-stage amplifier circuit increases due to a first compensation current $N \times I_{adaptive}$, the relationship between the output power POUT of the multi-stage amplifier circuit and the gain of the first-stage amplifier can be represented by the curve g3 in FIG. 5C. Likewise, if the bias current of the second-stage amplifier of a general multi-stage amplifier circuit increases due to a second compensation current $M \times I_{adaptive}$, the relationship between the output power POUT of the multi-stage amplifier circuit and the gain of the multi-stage amplifier can be represented by the curve g5 in FIG. 5B, and the gain of the second-stage amplifier can be represented just similar the curve g3 in FIG. 5C. Thus, by properly providing the first compensation current $N \times I_{adaptive}$ to the first-stage amplifier and the second compensation current $M \times I_{adaptive}$ to the second-stage amplifier, the gain of the multi-stage amplifier circuit could be compensated. That mean the gain curve of the multi-stage amplifier circuit will be shifted from curve g2 to g5 as shown in FIG. 5B to make the gain of the multi-stage amplifier circuit maintained and extended for dropping later when the output power POUT of the multi-stage amplifier circuit gets large.

To further illustrate how the current compensation circuit provided by each of the above embodiments adjusts the gain of an amplifier circuit for improving the linearity of the amplifier circuit, the working principle of the power detection circuit and the operational amplifier circuit in the current compensation circuit provided by each of the above embodiments is described as follows.

Figure 6:
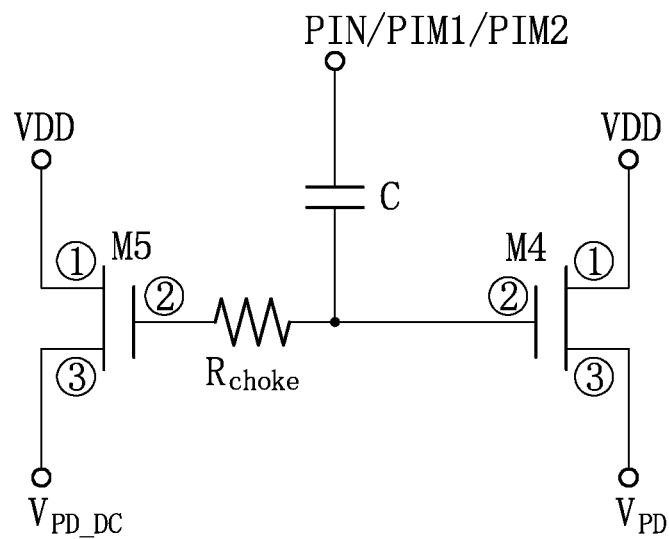
FIG. 6 shows a circuit diagram of a power detection circuit of a current compensation circuit according to one embodiment of the present disclosure.

Referring to FIG. 6, a circuit diagram of a power detection circuit of a current compensation circuit according to one embodiment of the present disclosure is shown. The current compensation circuit shown in FIG. 6 can be used in the current compensation circuit provided by each of the above embodiments.

As shown in FIG. 6, the power detection circuit 20 includes a capacitor C, a fourth transistor M4 and a fifth transistor M5. One end of the capacitor C is coupled to the input power PIN or the output power PIM1 of the first amplifier PA1 or the output power PIM2 of the second amplifier PA2. The fourth transistor M4 and the fifth transistor M5 respectively have a first end, a second end and a third end. For ease of illustration, in FIG. 6, the first ends of the fourth transistor M4 and the fifth transistor M5 are marked as ①, the second ends of the fourth transistor M4 and the fifth transistor M5 are marked as ②, and the third ends of the fourth transistor M4 and the fifth transistor M5 are marked as ③. In addition, the other end of the capacitor C is coupled to the second end of the fourth transistor M4, and also coupled to the second end of the fifth transistor M5 through a choke resistor $R_{choke}$. Moreover, the first end of the fourth transistor M4 and the first end of the fifth transistor M5 are coupled to a supply voltage VDD.

The power detection circuit 20 detects the input power PIN or the output power PIM1 of the first amplifier PA1, or detects the output power PIM2 of the second amplifier PA2. According to the circuit configuration of the power detection circuit 20 shown in FIG. 6, when the input power PIN or the output power PIM1 of the first amplifier PA1 is zero, or when the output power PIM2 of the second amplifier PA2 is zero, the voltage at the third end of the fifth transistor M5 equals the voltage at the third end of the fourth transistor M4.

Take a radio frequency (RF) amplifier circuit as example, when the radio frequency amplifier circuit has no RF input signal, the supply voltage VDD minus the voltage drop between the first end and the third end of the fourth transistor M4 equals the voltage at the third end of the fourth transistor M4, and the supply voltage VDD minus the voltage drop between the first end and the third end of the fifth transistor M5 equals the voltage at the third end of the fifth transistor M5. If the fourth transistor M4 and the fifth transistor M5 have the same size, the voltage at the third end of the fourth transistor M4 equals the voltage at the third end of the fifth transistor M5. When the radio frequency amplifier circuit has a RF input signal, the input power PIN and the output power PIM1 of the first amplifier PA1 and the output power PIM2 of the second amplifier PA2 are larger than zero. Thus, the voltage at the third end of the fourth transistor M4 increases due to the RF input signal. However, there is a choke resistor $R_{choke}$ configured between the capacitor C and the fifth transistor M5. The voltage at the third end of the fifth transistor M5 is hardly affected by the RF input signal because the choke resistor $R_{choke}$ is very large. In other words, the input power PIN and the output power PIM1 of the first amplifier PA1 and the output power of the second amplifier PA2 are less related to the voltage at the third end of the fifth transistor M5.

When the radio frequency amplifier circuit has a RF input signal, by the power detection circuit 20 shown in FIG. 6, a first detection voltage $V_{PD}$ is generated at the third end of the fourth transistor M4 and a calibration voltage $V_{PD\_DC}$ is generated at the third end of the fifth transistor M5.

It should be noted that, in one embodiment, the first end, the second and the third end of each of the transistors mentioned above are respectively a drain, a gate and a source.

Figure 7A:
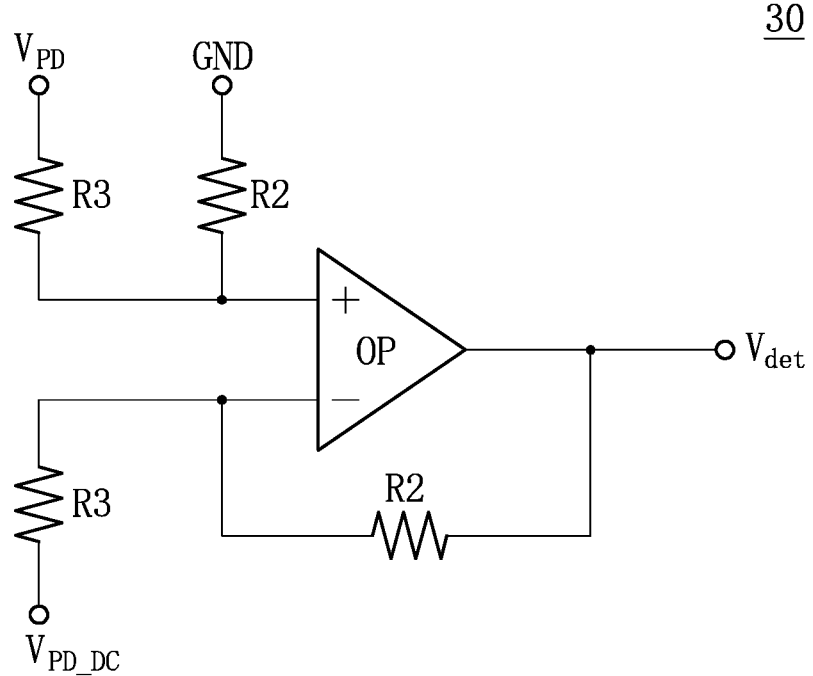
FIG. 7A shows a circuit diagram of an operational amplifier circuit of a current compensation circuit according to one embodiment of the present disclosure.

Referring to FIG. 7A, a circuit diagram of an operational amplifier circuit of a current compensation circuit according to one embodiment of the present disclosure is shown. The operational amplifier circuit in FIG. 7A can be used in the current compensation circuit provided by each of the above embodiments.

As shown in FIG. 7A, the operational amplifier circuit 30 includes an operational amplifier OP. The non-inverting input end of the operational amplifier OP is coupled to a reference voltage GND through a second resistor R2, and is also coupled to the third end of the fourth transistor M4 in the power detection circuit 20 through a third resistor R3 to receive the first detection voltage $V_{PD}$. The inverting input end of the operational amplifier OP is coupled to an output end of the operational amplifier OP through another second resistor R2, and is also coupled to the third end of the fifth transistor M5 in the power detection circuit 20 through another third resistor R3 to receive the calibration voltage $V_{PC\_DC}$.

The operational amplifier circuit 30 calculates a second detection voltage $V_{det}$ according to the first detection voltage $V_{PD}$ and the calibration voltage $V_{PC\_DC}$. Based on the circuit configuration of the operational amplifier circuit 30 in FIG. 7A, the second detection voltage $V_{det}$ can be represented as the following Equation 1.

$$V_{det}=R2/R3(V_{PD}-V_{PD\_DC}) \qquad \text{(Equation 1)}$$

In the Equation 1, R2 is the second resistor, R3 is the third resistor, $V_{PD}$ is the first detection voltage, $V_{PD\_DC}$ is calibration voltage, and $V_{det}$ is the second detection voltage.

According to the Equation 1, the second detection voltage $V_{det}$ is related to the voltage difference between the first detection voltage $V_{PD}$ and the calibration voltage $V_{PC\_DC}$. Subtracting the calibration voltage $V_{PC\_DC}$ from the first detection voltage $V_{PD}$ is to exclude the voltage that is barely related to the input power PIN and the output power PIM1 of the first amplifier PA1, and to the output power PIM2 of the second amplifier PA2. In this manner, the compensation current from the current compensation circuit should be provided by precisely calculating.

It is worth mentioning that, in this embodiment, the second resistor R2 and the third resistor R3 can be implemented by a variable resistor. For example, if the power detection circuit is configured to detect the output power PIM1 of the first amplifier PA1, the resistance ratio of the second resistor R2 to the third resistor R3 in the Equation 1 is related to the slope of a curve showing the relationship between the output power PIM1 and the input power PIN of the first amplifier PA1. In short, the resistance ratio of the second resistor R2 to the third resistor R3 in the Equation 1 is related to the slope of a curve showing the relationship between the output power and the input power of the first amplifier (i.e. is related to the slope of the gain curve of the first amplifier PA1). Thus, the second detection voltage $V_{det}$ can be adjusted to modify the first compensation current $N \times I_{adaptive}$ which is provided to the first amplifier PA1 by adjusting resistance ratio of the second resistor R2 to the third resistor R3. In other words, by adjusting the resistance ratio of the second resistor R2 to the third resistor R3, the curve representing the relationship between the output power and the gain of the first amplifier PA1 can shift like the curve g3 or the curve g4 in FIG. 5C instead of the curve g1 in FIG. 5A. That is, by adjusting the resistance ratio of the second resistor R2 to the third resistor R3, the after-rising-slope of the gain of the first amplifier PA1 could be increased from the curve g3 to the curve g4 in FIG. 5C.

Figure 7B:
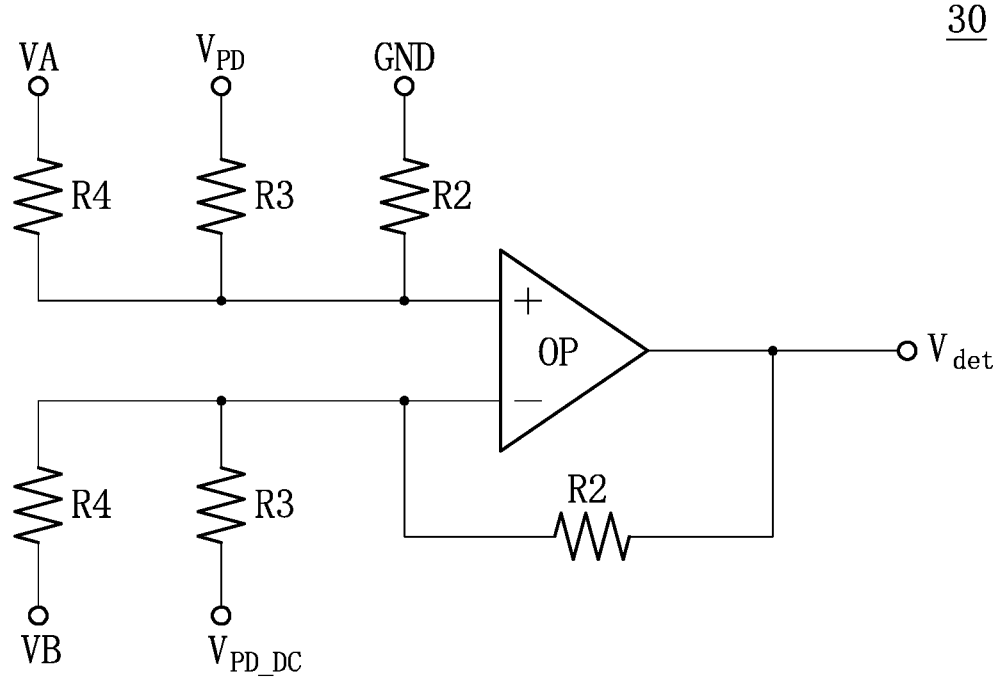
FIG. 7B shows a circuit diagram of an operational amplifier circuit of a current compensation circuit according to another embodiment of the present disclosure

Referring to FIG. 7B, a circuit diagram of an operational amplifier circuit of a current compensation circuit according to another embodiment of the present disclosure is shown. The operational amplifier circuit in FIG. 7B can be used in the current compensation circuit provided by each of the above embodiments.

The operational amplifier circuit shown in FIG. 7B and the operational amplifier circuit shown in FIG. 7A have similar circuit configurations. The difference between the two operational amplifier circuits is that, in the operational amplifier circuit shown in FIG. 7B, the non-inverting input end of the operational amplifier OP is further coupled to a first reference voltage VA through a fourth resistor R4, and the inverting input end of the operational amplifier OP is further coupled to a second reference voltage VB through another fourth resistor R4.

The operational amplifier circuit 30 calculates the second detection voltage $V_{det}$ according to the first detection voltage $V_{PD}$, the calibration voltage $V_{PD\_DC}$, the first reference voltage VA and the second reference voltage VB. Based on the circuit configuration of the operational amplifier circuit 30 in FIG. 7B, the second detection voltage $V_{det}$ can be represented as the following Equation 2.

$$V_{det}=R2/R3(V_{PD}-V_{PD\_DC})+R3/R4(VA-VB) \quad \text{(Equation 2)}$$

In the Equation 2, R2 is the second resistor, R3 is the third resistor, R4 is the fourth resistor, $V_{PD}$ is the first detection voltage, $V_{PD\_DC}$ is the calibration voltage, $V_{det}$ is the second detection voltage, VA is the first reference voltage, and VB is the second reference voltage.

According to the Equation 2, in addition to the voltage difference between the first detection voltage $V_{PD}$ and the calibration voltage $V_{PD\_DC}$, the second detection voltage $V_{det}$ is also related to the voltage difference between the first reference voltage VA and the second reference voltage VB. It is worth mentioning that, the first reference voltage VA and the second reference voltage VB can be provided by variable voltage sources.

For example, if the power detection circuit is configured to detect the output power PIM1 of the first amplifier PA1 of a multi-stage amplifier circuit, by adjusting the voltage difference between the first reference voltage VA and the second reference voltage VB, the curve representing the relationship between the output power of the multi-stage amplifier circuit and the gain of the first amplifier PA1 can shift from the curve g3 to the curve g6 in FIG. 5C. In other words, the voltage difference between the first reference voltage VA and the second reference voltage VB is related to the raising point of the curve representing the relationship between the output power of the multi-stage amplifier circuit and the gain of the first amplifier PA1 shown in FIG. 5C.

In this example, from one aspect, the first compensation current $N \times I_{adaptive}$ provided to the first amplifier PA1 by the current compensation circuit can be adjusted by adjusting the resistance ratio of the second resistor R2 to the third resistor R3 and by adjusting the voltage difference between the first reference voltage VA and the second reference voltage VB. From another aspect, the slope of the gain curve which is representing the relationship between the output power of the multi-stage amplifier circuit and the gain of the first amplifier PA1, can be determined by the resistance ratio of the second resistor R2 to the third resistor R3, and the raising point for the gain curve which is representing the relationship between the output power of the multi-stage amplifier circuit and the gain of the first amplifier PA1, can also be determined by the voltage difference between the first reference voltage VA and the second reference voltage VB.

To sum up, the current compensation circuit provided by the present disclosure can provide a proper compensation current to amplifiers in a single-stage amplifier circuit or a multi-stage amplifier circuit by detecting the power of the single-stage amplifier circuit or the multi-stage amplifier circuit. In this manner, the bias currents of the amplifiers of the single-stage amplifier circuit or the multi-stage amplifier circuit can be all or selectively increased so that the curve representing the output power of the amplifier circuit and the gain of amplifiers of the amplifier circuit can be adjusted. As a result, the gain of the amplifier circuit will never get saturated and gradually decreased even when the output power of the amplifier circuit gets large. Thus, the entire amplifier circuit can have a great linearity due to the current compensation circuit provided by the present disclosure.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A current compensation circuit, providing a current to an amplifier circuit, wherein the amplifier circuit includes a first amplifier, a first transistor and a first bias circuit, the first bias circuit provides a first bias current to the first amplifier, and the first bias circuit is coupled to the first transistor, comprising:
   a power detection circuit, coupled to the first amplifier, configured to detect an input power or an output power of the first amplifier, and convert a detected power to a first detection voltage;
   an operational amplifier circuit, coupled to the power detection circuit, configured to generate a second detection voltage according to the first detection voltage and a calibration voltage; and
   a voltage-to-current converter, coupled to the operational amplifier circuit, configured to convert the second detection voltage to a compensation current;
   wherein the voltage-to-current converter is coupled to the first transistor,
   a first compensation current flows to the first amplifier through the first transistor according to the compensation current, and
   the first amplifier is driven by a sum of the first compensation current and the first bias current.

2. The current compensation circuit according to claim 1, wherein the voltage-to-current converter includes a transfer transistor, the transfer transistor and the first transistor form a current mirror structure such that the first compensation current is directly proportional to the compensation current outputted from the voltage-to-current converter.

3. The current compensation circuit according to claim 2, wherein the amplifier circuit further includes a second amplifier, a second transistor and a second bias circuit, the second amplifier is coupled to the first amplifier, the second bias circuit provides a second bias current to the second amplifier, and the second bias circuit is coupled to the second transistor;
   wherein the second transistor is coupled to the voltage-to-current converter, a second compensation current flows to the second amplifier or the second bias circuit through the second transistor according to the compensation current for driving the second amplifier.

4. The current compensation circuit according to claim 3, wherein the size ratio of the first transistor to the transfer transistor and the size ratio of the second transistor to the transfer transistor are related respectively to the slope of a curve showing the relationship between the output power and the input power of the first amplifier and the slope of a curve showing the relationship between the output power and the input power of the second amplifier.

5. The current compensation circuit according to claim 3, wherein the size ratio of the first transistor to the transfer transistor and the size ratio of the second transistor to the transfer transistor are different.

6. The current compensation circuit according to claim 3, wherein the first amplifier is a first-stage amplifier of the amplifier circuit, the second amplifier is a second-stage amplifier of the amplifier circuit, and the power detection circuit is coupled between the first-stage amplifier and the second-stage amplifier.

7. The current compensation circuit according to claim 3, wherein the transfer transistor and the second transistor form a current mirror structure such that the second compensation current is directly proportional to the compensation current outputted from the voltage-to-current converter.

8. The current compensation circuit according to claim 1, wherein the power detection circuit further outputs the calibration voltage.

9. The current compensation circuit according to claim 8, wherein the first amplifier has an input end and an output end, the power detection circuit is further configured to detect an input power of the input end of the first amplifier or an output power of the output end of the first amplifier, and the power detection circuit includes:
a capacitor, wherein one end of the capacitor is coupled to the input end or the output end of the first amplifier;
a fourth transistor, having a first end, a second end and a third end; and
a fifth transistor, having a first end, a second end and a third end;
wherein the other end of the capacitor is coupled to the second end of the fourth transistor and also coupled to the second end of the fifth transistor through a choke resistor, the first end of the fourth transistor and the first end of the fifth transistor are configured to couple to a supply voltage, the first detection voltage is outputted from the third end of the fourth transistor, and the calibration voltage is outputted from the third end of the fifth transistor.

10. The current compensation circuit according to claim 9, wherein when the input power or the output power of the first amplifier is zero, the voltage at the third end of the fifth transistor equals the voltage at the third end of the fourth transistor, and when the input power or the output power of the first amplifier is larger than zero, the voltage at the third end of the fifth transistor remains and the voltage at the third end of the fourth transistor increases to be the first detection voltage.

11. The current compensation circuit according to claim 1, wherein the operational amplifier circuit includes:
an operational amplifier, wherein a non-inverting input end of the operational amplifier is configured to couple to a reference voltage through a second resistor and is also coupled to the first detection voltage through a third resistor, and an inverting input end of the operational amplifier is coupled to an output end of the operational amplifier through another second resistor and is also coupled to the calibration voltage through another third resistor.

12. The current compensation circuit according to claim 11, wherein the resistance ratio of the second resistor to the third resistor is related to the slope of a gain curve of the first amplifier.

13. The current compensation circuit according to claim 11, wherein the non-inverting input end of the operational amplifier is further configured to couple to a first reference voltage through a fourth resistor, and the inverting input end of the operational amplifier is further configured to couple to a second reference voltage through another fourth resistor.

14. The current compensation circuit according to claim 13, wherein the voltage difference between the first reference voltage and the second reference voltage is related to the raising point of a gain curve of the first amplifier.

15. A current compensation circuit, providing a current to an amplifier circuit, wherein the amplifier circuit includes a first amplifier, a first transistor, a first bias circuit, a second amplifier, a second transistor, a second bias circuit, and a third amplifier, the first bias circuit provides a first bias current to the first amplifier, the second bias circuit provides a second bias current to the second amplifier, and the first bias circuit and the second bias circuit are coupled to the first transistor and the second transistor respectively, comprising:
a power detection circuit, coupled to an output end of the first amplifier or an output end of the second amplifier, configured to detect an output power of the first amplifier or an output power of the second amplifier, and convert a detected power to a first detection voltage;
an operational amplifier circuit, coupled to the power detection circuit, configured to generate a second detection voltage according to the first detection voltage and a calibration voltage; and
a voltage-to-current converter, coupled to the operational amplifier circuit, configured to convert the second detection voltage to a compensation current;
wherein the first transistor and the second transistor are coupled to the voltage-to-current converter, a first compensation current flows to the first amplifier-through the first transistor according to the compensation current, and the first amplifier is driven by a sum of the first compensation current and the first bias current, or a second compensation current flows to the second amplifier or the second bias circuit through the second transistor according to the compensation current, and the second amplifier is driven by a sum of the second compensation current and the second bias current.

16. The current compensation circuit according to claim 15, wherein the current compensation circuit is configured to compensate the gain dropping of the amplifier circuit.

17. The current compensation circuit according to claim 15, wherein the first amplifier is a first-stage amplifier of the amplifier circuit, the second amplifier is a second-stage amplifier of the amplifier circuit, and the third amplifier is a third-stage amplifier of the amplifier circuit.

18. The current compensation circuit according to claim 15, wherein the voltage-to-current converter includes a transfer transistor, the transfer transistor and the first transistor form a current mirror structure, and the transfer transistor and the second transistor form another current mirror structure, such that the first compensation current and the second compensation current are directly proportional to the compensation current outputted from the voltage-to-current converter.

19. The current compensation circuit according to claim 15, wherein the first compensation current flows to the first bias circuit through the first transistor according to the compensation current, and the second compensation current flows to the second bias circuit through the second transistor according to the compensation current.

20. A current compensation circuit, providing a current to an amplifier circuit, wherein the amplifier circuit includes a first amplifier and a first transistor, and the first amplifier is configured to couple to a supply voltage through the first transistor, comprising:
a detection circuit, coupled to the first amplifier, configured to output a first detection voltage according to the signal strength of an input signal or the signal strength of an output signal of the first amplifier;

an operational amplifier circuit, coupled to the detection circuit, configured to generate a second detection voltage according to the first detection voltage and a calibration voltage; and a voltage-to-current converter, coupled to the operational amplifier circuit, configured to convert the second detection voltage to a compensation current, wherein the voltage-to-current converter includes a transfer transistor, the transfer transistor has a first end, a second end and a third end, the first end of the transfer transistor is configured to couple to the supply voltage, the third end of the transfer transistor is configured to couple to a reference voltage, and the second end of the transfer transistor is coupled to the operational amplifier circuit and the first transistor;

wherein the transfer transistor and the first transistor form a current mirror structure to generate a first compensation current, and the first amplifier is driven by a sum of the first compensation current and a first bias current.

* * * * *